US005754073A

United States Patent [19]

Kimura

[11] Patent Number: 5,754,073

[45] Date of Patent: May 19, 1998

[54] ANALOG MULTIPLIER

[75] Inventor: Katsuji Kimura, Tokyo, Japan

[73] Assignee: NEC Corporation, Tokyo, Japan

[21] Appl. No.: 153,920

[22] Filed: Nov. 17, 1993

[30] Foreign Application Priority Data

Nov. 18, 1992 [JP] Japan .................................... 4-332583

[51] Int. Cl.$^6$ .............................. H03F 3/45; G06G 7/16; G06G 7/164

[52] U.S. Cl. ............................................ 327/359; 357/356

[58] Field of Search .................................... 307/529, 494, 307/497, 495; 328/160, 144; 455/333; 327/347, 349, 355, 356, 357, 359

[56] References Cited

U.S. PATENT DOCUMENTS

| | | | |
|---|---|---|---|
| 4,353,000 | 10/1982 | Noda | 328/144 |
| 4,546,275 | 10/1985 | Pena-Finol et al. | 307/529 |
| 4,558,283 | 12/1985 | Yamagiwa | 307/529 |
| 4,694,204 | 9/1987 | Nishijima et al. | 307/529 |
| 5,039,889 | 8/1991 | Janta et al. | 307/529 |
| 5,107,150 | 4/1992 | Kimura | 307/529 |
| 5,252,866 | 10/1993 | Kimura | 307/529 |

FOREIGN PATENT DOCUMENTS

| | | | |
|---|---|---|---|
| 405267353 | 7/1993 | Japan | 307/529 |

OTHER PUBLICATIONS

Z. Wang, "*Novel linearisation technique for implementing large–signal MOS tunable transconductor*", Electronic Letters, vol. 26, No. 2, pp. 138–139, Jan. 18, 1990.

K. Kimura, "*A Unified Analysis of Four–Quadrant Analog Multipliers Consisting of Emitter and Source–Coupled Transistors Operable on Low Supply Voltage*", *IEICE* Transactions on Electronics, vol. E76–C, No. 5, pp. 714–737, May 1993.

H. Song, et al., "*An MOS Four–Quadrant Analog Multiplier Using Simple Two–Input Squaring Circuits with Source Followers*", *IEEE Journal of Solid–State Circuits*, vol. 25, No. 3, pp. 841–847, Jun. 1990.

Abstract SU 1113–810–A from *Soviets Inventions Illustrated*, Section EI, Week 8515, May 22, 1985.

IEEE Journal of Solid–State Circuits, vol. 26, No. 9, Sep. 1991, "A CMOS Four–Quadrant Analog Multiplier with Single–Ended Voltage Output and Improved Temperature Performance" by Zhenhu Wang, pp. 1293–1301.

*Primary Examiner*—Timothy P. Callahan
*Assistant Examiner*—T. T. Lam
*Attorney, Agent, or Firm*—Ostrolenk, Faber, Gerb & Soffen, LLP

[57] ABSTRACT

A multiplier containing first and second squaring circuits, in which the first squaring circuit has first and second differential transistor-pairs and the second squaring circuit has third and fourth ones. A positive output end of the first squaring circuit and an opposite output end of the second squaring circuit are coupled together, and an opposite output end of the first squaring circuit and a positive output end of the second squaring circuit are coupled together, which constitutes a pair of differential output ends of the multiplier. Sum and difference of first and second input voltages are applied to the differential input ends of the first and second squaring circuits, respectively. A first DC voltage is commonly applied across respective input ends of the first and second transistor-pairs, and a second one across the other input ends thereof. The second DC voltage is applied equal in polarity to the first DC voltage. Reduction of a power source voltage and simplification of circuit configuration can be obtained.

9 Claims, 10 Drawing Sheets

ANALOG MULTIPLIER

BACKGROUND OF THE INVENTION

1. Field of the Invention

The present invention relates to a multiplier for multiplying analog signals and more particularly, to a multiplier adapted to be arranged on bipolar or Metal Oxide Semiconductor (MOS) integrated circuits.

2. Description of the Prior Art

Conventionally, a Gilbert multiplier has been employed in general as a multiplier formed of bipolar transistors. The Gilbert multiplier has such a structure that transistor pairs are provided in a two-stage stacked manner as shown in FIG. 1. The operation thereof will be explained below.

In FIG. 1, an electric current (emitter current) $I_E$ of a p-n junction diode forming a transistor can be expressed by the following equation (1), where $I_s$ is the saturation current, k is Boltzmann's constant, q is the unit electron charge, $V_{BE}$ is base-to-emitter voltage of the transistor and T is absolute temperature.

$$I_E = I_s[\exp\{(qV_{BE})/(kT)\} - 1] \quad (1)$$

Here, if $V_T = kT/q$, as $V_{BE} >> V_T$, when $\exp(V_{BE}/V_T) >> 1$ in the equation (1), the emitter current $I_E$ can be approximated as follows;

$$I_E \approx I_s \exp(V_{BE}/VT) \quad (2)$$

As a result, collector currents $I_{C43}$, $I_{C44}$, $I_{C45}$, $I_{C46}$, $I_{41}$ and $I_{C42}$ of the transistors Q43, Q44, Q45, Q46, Q41 and Q42 can be expressed by the following equations (3), (4), (5), (6), (7) and (8), respectively;

$$I_{C43} = \frac{\alpha_F \cdot I_{C41}}{1 + \exp\left(-\frac{V_{41}}{V_T}\right)} \quad (3)$$

$$I_{C44} = \frac{\alpha_F \cdot I_{C41}}{1 + \exp\left(\frac{V_{41}}{V_T}\right)} \quad (4)$$

$$I_{C45} = \frac{\alpha_F \cdot I_{C42}}{1 + \exp\left(\frac{V_{41}}{V_T}\right)} \quad (5)$$

$$I_{C46} = \frac{\alpha_F \cdot I_{C42}}{1 + \exp\left(-\frac{V_{41}}{V_T}\right)} \quad (6)$$

$$I_{C41} = \frac{\alpha_F \cdot I_0}{1 + \exp\left(-\frac{V_{42}}{V_T}\right)} \quad (7)$$

$$I_{C42} = \frac{\alpha_F \cdot I_0}{1 + \exp\left(\frac{V_{42}}{V_T}\right)} \quad (8)$$

In the equations (3), (4), (5), (6), (7) and (8), $V_{41}$, is an input voltage of the transistors Q43, Q44, Q45 and Q46, $V_{42}$ is an input voltage of the transistors Q41 and Q42, $\alpha_F$ is the DC common-base current gain factor thereof.

Hence, the collector currents $I_{C43}$, $I_{C44}$, $I_{C45}$ and $I_{C46}$ of the transistors Q43, Q44, Q45 and Q46 can be expressed by the following equations (9), (10), (11) and (12), respectively;

$$I_{C43} = \frac{\alpha_F^2 \cdot I_0}{\left\{1 + \exp\left(-\frac{V_{41}}{V_T}\right)\right\}\left\{1 + \exp\left(-\frac{V_{42}}{V_T}\right)\right\}} \quad (9)$$

$$I_{C44} = \frac{\alpha_F^2 \cdot I_0}{\left\{1 + \exp\left(\frac{V_{41}}{V_T}\right)\right\}\left\{1 + \exp\left(-\frac{V_{42}}{V_T}\right)\right\}} \quad (10)$$

$$I_{C45} = \frac{\alpha_F^2 \cdot I_0}{\left\{1 + \exp\left(\frac{V_{41}}{V_T}\right)\right\}\left\{1 + \exp\left(\frac{V_{42}}{V_T}\right)\right\}} \quad (11)$$

$$I_{C46} = \frac{\alpha_F^2 \cdot I_0}{\left\{1 + \exp\left(-\frac{V_{41}}{V_T}\right)\right\}\left\{1 + \exp\left(\frac{V_{42}}{V_T}\right)\right\}} \quad (12)$$

As a result, the differential current ΔI between an output current $I_{C43-45}$ and an output current $I_{C44-46}$ can be expressed as the following equation (13);

$$\begin{aligned} \Delta I &= I_{C43-45} - I_{C44-46} \\ &= (I_{C43} + I_{C45}) - (I_{C44} + I_{C46}) \\ &= (I_{C43} - I_{C46}) - (I_{C44} - I_{C45}) \\ &= \alpha_F^2 \cdot I_0 \left\{ \tanh\left(\frac{V_{41}}{2V_T}\right) \right\} \left\{ \tanh\left(\frac{V_{42}}{2V_T}\right) \right\} \end{aligned} \quad (13)$$

Here, tanh x can be expanded in series as shown by the following equation (14) as;

$$\tanh X = X - \frac{X^3}{3} \quad (14)$$

Then, if $|x| << 1$, it can be approximated as $\tanh x \approx x$.

Accordingly, if $|V_{41}| << 2V_T$ and $|V_{42}| << 2V^T$, the differential current ΔI can be approximated by the following equation (15);

$$\Delta I = \frac{I_0}{4}\left(\frac{\alpha F}{V_T}\right)^2 V_{41} \cdot V_{42} \quad (15)$$

From the equation (15), since the differential current ΔI contains a product of the input signal voltages $V_{41}$ and $V_{42}$, it can be found that the circuit shown in FIG. 1 becomes a multiplier for the input voltage voltages $V_{41}$ and $V_{42}$.

Next, with a multiplier formed of MOS transistors, a lot of sorts of multipliers have been developed for the recent ten years. One of these conventional MOS multipliers is that proposed by Z. Wang, which can be considered to be put to practical use. This multiplier is disclosed in IEEE JOURNAL OF SOLID-STATE CIRCUITS, Vol. 26, No, 9, September 1991 entitled "A CMOS Four-Quadrant Analog Multiplier with Single-Ended Voltage Output and Improved Temperature Performance", so that description about it is omitted.

The conventional Gilbert multiplier as explained above has such the transistor pairs stacked in two stages, so that there arises such a problem that the power source voltage cannot be decreased.

Besides, the conventional multiplier proposed by Z. Wang has such a problem that its circuit scale is very large since a lot of current mirror circuits are employed.

SUMMARY OF THE INVENTION

Accordingly, an object of the present invention is to provide a multiplier capable of reducing a power source voltage.

Another object of the present invention is to provide a multiplier which is simple in circuit configuration.

A multiplier according to a first aspect of the present invention contains first and second squaring circuits. The first squaring circuit has first and second differential transistor-pairs, differential input ends and differential output ends. The second squaring circuit has third and fourth differential transistor-pairs, differential input ends and differential output ends.

A positive one of the differential output ends of the first squaring circuit and an opposite one of the differential output ends of the second squaring circuit are coupled together. An opposite one of the differential output ends of the first squaring circuit and a positive one of the differential output ends of the second squaring circuit are coupled together. The output ends thus coupled together constitute a pair of differential output ends of the multiplier.

Sum of first and second input voltages is applied to the differential input ends of the first squaring circuit, and difference of the first and second input voltages is applied to the differential input ends of the second squaring circuit.

A first direct current (DC) voltage is applied between a first input end of the first differential transistor-pair and a first input end of the second differential transistor-pair. A second DC voltage is applied between a second input end of the first differential transistor-pair and a second input end of the second differential transistor-pair. The second DC voltage is applied equal in polarity to the first DC voltage.

A multiplier according to a second aspect of the present invention contains first, second, third and fourth differential transistor-pairs.

First output ends of the first to fourth differential transistor-pairs are coupled together and second output ends of the first to fourth differential transistor-pairs are coupled together. The first output ends and second output ends thus coupled together constitute a pair of differential output ends of the multiplier.

A first input voltage superposed on a first reference voltage, which are opposite in phase to each other, is applied in common to the first input end of the first differential transistor-pair and the second input end of the third differential transistor-pair. The first input voltage superposed on a first reference voltage, which are equal in phase to each other, is applied in common to the first input end of the second differential transistor-pair and the second input end of the fourth differential transistor-pair.

A second input voltage superposed on a second reference voltage, which are equal in phase to each other, is applied in common to a second input end of the first differential transistor-pair and a first input end of the fourth differential transistor-pair. The second input voltage superposed on the second reference voltage, which are opposite in phase to each other, is applied in common to a second input end of the second differential transistor-pair and a first input end of the third differential transistor-pair. The second reference voltage is different in value from the first reference voltage.

A multiplier according to a third aspect of the present invention contains first, second and third squaring circuits. The first squaring circuit has first and second differential transistor-pairs, differential input ends and differential output ends. The second squaring circuit has third and fourth differential transistor-pairs, differential input ends and differential output ends. The third squaring circuit has fifth and sixth differential transistor-pairs, differential input ends and differential output ends.

A positive one of the differential output ends of the first squaring circuit and opposite ones of the differential output ends of the second and third squaring circuits are coupled together. An opposite one of the differential output ends of the first squaring circuit and positive ones of the differential output ends of the second and third squaring circuits are coupled together. The output ends thus coupled constitute a pair of differential output ends of the multiplier.

Difference of first and second input voltages is applied to the differential input ends of the first squaring circuit, and sum of the first and second input voltages is applied respectively to the positive ones of the differential input ends of the second and third squaring circuits. The opposite ones of the differential input ends of the second and third squaring circuits are held at constant electric potentials, respectively.

With the multiplier according to the third aspect, preferably, a fourth squaring circuit is provided, which contains seventh and eighth differential transistor-pairs, differential input ends and differential output ends. Positive and opposite ones of the differential output ends of the fourth squaring circuit are connected respectively to positive and opposite ones of the differential output ends of the first squaring circuit. The differential input ends of the fourth squaring circuit are coupled together to be held at a constant electric potential. The fourth squaring circuit serves to remove a DC component from an output of the multiplier.

With the multipliers according to the first and second aspects, there are provided with the first to fourth differential transistor-pairs arranged so-called in a line transversely, not in a stack manner, to be driven by the same power source voltage. With the multiplier according to the third aspect, there are provided with the first to sixth differential transistor-pairs arranged and to be driven similarly.

Additionally, the first to fourth or sixth differential transistor-pairs are applied with the first and second input voltages superposed on the positive or negative DC voltage (bias voltage) to obtain the square-law characteristic.

As a result, the multipliers of the first to third aspects can be operated at a lower power source voltage than that in the prior art, and they are simple in circuit configuration since they are basically composed of the differential transistor-pairs arranged in a line transversely.

In addition, the respective differential transistor-pairs may be composed of the minimum unit transistors, so that the multipliers of the first to third aspects are suitable for high-frequency operation.

DETAILED DESCRIPTION OF THE PREFERRED EMBODIMENTS

Preferred embodiments of the present invention will be described below while referring to FIGS. 2 to 13.

[First Embodiment]

FIGS. 2 to 5 show a multiplier according to a first embodiment of the present invention, which is formed of two squaring circuits.

Figure 1:
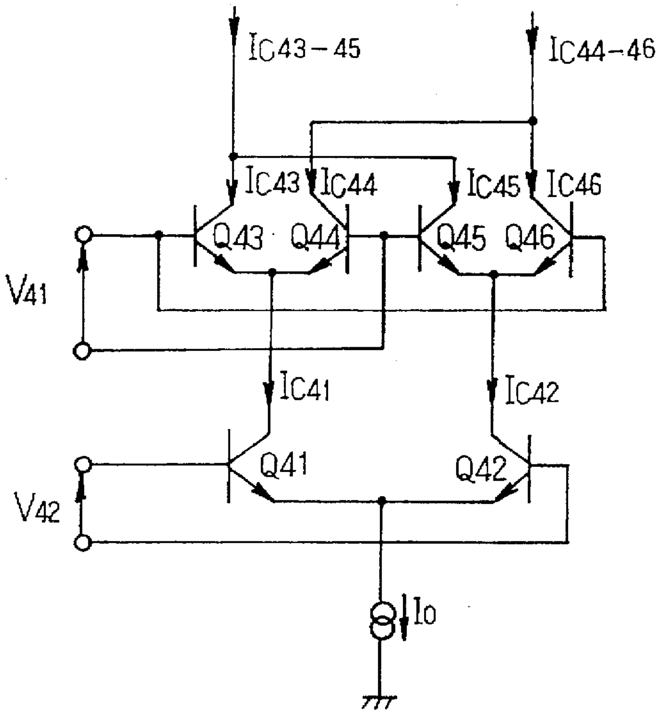
FIG. 1 PRIOR ART
FIG. 1 is a circuit diagram of a conventional multiplier formed of bipolar transistors.
Figure 2:
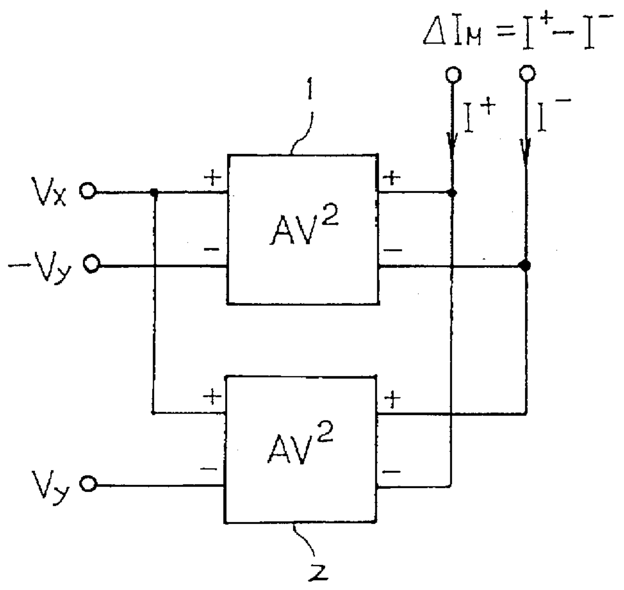
FIG. 2 is a block diagram of a multiplier according to first and second embodiments of the present invention.

In FIG. 2, first and second squaring circuits 1 and 2 are the same in circuit configuration, each of which has a pair of differential input ends and a pair of differential output ends. Positive (+) one of the differential output ends of the first squaring circuit 1 and opposite (−) one of the differential output ends of the second squaring circuit 2 are coupled together, and opposite (−) one of the differential output ends of the first squaring circuit 1 and positive (+) one of the differential output ends of the second squaring circuit 2 are coupled together. These respective output ends coupled together constitute a pair of differential output ends of the multiplier.

In the first squaring circuit 1, a first input signal (voltage: $V_x$) is applied to the positive (+) one of the differential input ends and a signal (voltage: $-V_y$) opposite in phase to a second input signal (voltage: $V_y$) is applied to the opposite (−) one of the differential input ends. Thus, the sum voltage $(V_x+V_y)$ of the first and second input signals is applied across the differential input ends.

In the second squaring circuit 2, the first input signal is applied to the positive (+) one of the differential input ends and the second input signal is applied to the opposite (−) one of the differential input ends. Thus, the difference voltage $(V_x-V_y)$ of the first and second input signals is applied across the differential input ends.

The output ends of the first and second squaring circuits 1 and 2 are connected as above, so that output currents $I^+$ and $I^-$ derived from the respective differential output ends of the multiplier are subtracted each other. Therefore, a differential output current $\Delta I_M$ of the multiplier is expressed as the following equation (16);

$$\begin{aligned}\Delta I_M &= I^+ - I^- \\ &= A(V_x+V_y)^2 - A(V_x-V_y)^2 \\ &= 4A\,V_x\cdot V_y\end{aligned} \tag{16}$$

That is, the differential output current $\Delta I_M$ is proportional to the product $(V_x\cdot V_y)$ of the first and second input signal voltages $V_x$ and $V_y$, which means that the circuit comprising the squaring circuits 1 and 2 as shown in FIG. 2 has a multiplier characteristic.

Next, the configuration of the first and second squaring circuits 1 and 2 is shown below. Since the circuits 1 and 2 are the same in configuration, only that of the circuits 1 is described here.

Figure 3:
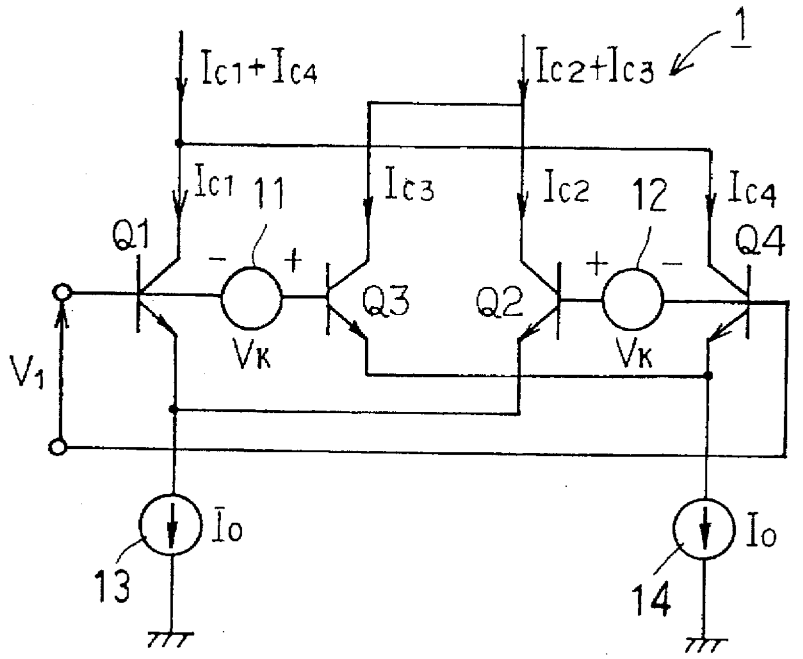
FIG. 3 is a circuit diagram of a squaring circuit used for the multiplier according to the first embodiment, which is formed of bipolar transistors.

FIG. 3 shows the squaring circuit 1 concretely, which is formed of bipolar transistors. In FIG. 3, The circuit 1 is comprised of a first differential pair driven by a first constant current source 13 (current: $I_0$) and a second differential pair driven by a second constant current source 14 (current: $I_0$). The first differential pair is composed of bipolar transistors Q1 and Q2 whose emitters are connected in common to the first constant current source 13. The second differential pair is composed of bipolar transistors Q3 and Q4 whose emitters are connected in common to the second constant current source 14.

Collectors of the transistors Q1 and Q4 are coupled together and those of the transistors Q2 and Q3 are coupled together. These collectors thus coupled together constitute a pair of differential output ends of the squaring circuit 1, respectively.

Bases of the transistors Q1 and Q4 constitute a pair of differential input ends of the squaring circuit 1, and the first input voltage $V_1$ is applied therebetween.

There is a first DC voltage source 11 whose supply voltage is $V_k$ between the bases of the transistors Q1 and Q3. A positive (+) end of the first voltage source 11 is connected to the base of the transistor Q3 and a negative (−) end thereof is to the base of the transistor Q1. Similarly, there is a second DC voltage source 12 whose supply voltage is the same as that of the voltage source 11, or $V_k$, between the bases of the transistors Q2 and Q4. A positive (+) end of the voltage source 12 is connected to the base of the transistor Q2 and a negative (−) end thereof is to the base of the transistor Q4.

Therefore, a first DC bias voltage $V_k$ is applied across the bases of the transistors Q1 and Q3 and a second DC bias voltage $V_k$, which is equal in value to the first one, is applied across the bases of the transistors Q4 and Q2. The first and second bias voltages are applied in the same polarities.

Operation of the squaring circuit 1 is as follows;

If the DC common-base current gain factor of the transistors Q1 to Q4 is expressed as $\alpha_F$, collector currents $I_{C1}$ and $I_{C2}$ of the transistors Q1 and Q2 can be expressed as the following equations (17-1) and (17-2);

$$I_{C1} = \frac{\alpha_F \cdot I_0}{1+\exp\left(-\dfrac{V_1+V_K}{V_T}\right)} \tag{17-1}$$

$$I_{C2} = \frac{\alpha_F \cdot I_0}{1+\exp\left(\dfrac{V_1+V_K}{V_T}\right)} \tag{17-2}$$

The collector currents $I_{C1}$ and $I_{C2}$ satisfy the following equation (18).

$$\alpha_F I_0 = I_{C1} + I_{C2} \tag{18}$$

Hence, a differential output current $\Delta I_1$, of the first differential pair can be expressed as follows;

$$\begin{aligned}\Delta I_1 &= I_{C1} - I_{C2} \\ &= \alpha_F I_0 \tanh\{(V_1+V_K)/(2V_T)\}\end{aligned} \tag{19}$$

Similarly, a differential output current $\Delta I_2$ of the second differential pair is expressed as follows;

$$\begin{aligned}\Delta I_2 &= I_{C3} - I_{C4} \\ &= \alpha_F \cdot I_0 \tanh\{(V_1-V_K)/(2V_T)\}\end{aligned} \tag{20}$$

where $I_{C3}$ and $I_{C4}$ are collector currents of the transistors Q3 and Q4, respectively.

Then, a differential output current $\Delta I_{SQ1}$ of the squaring circuit 1 as shown in FIG. 3 can expressed as follows;

$$\begin{aligned}\Delta I_{SQ1} &= (I_{C1}+I_{C4})-(I_{C2}+I_{C3}) \\ &= (I_{C1}-I_{C2})-(I_{C3}-I_{C4}) \\ &= \Delta I_1-\Delta I_2 \\ &= \alpha_F\cdot I_0\,[\tanh\{(V_1+V_K)/(2V_T)\}-\tanh\{(V_1-V_K)/(2V_T)\}]\end{aligned} \tag{21}$$

Here, tanh x can be expanded as shown in the equation (14) when $|x|<<1$, so that when $|V_1+V_k|<<2V_T$ and $|V_1-V_k|<<2V_T$, the equation (21) becomes as shown by the following equation (22);

$$\begin{aligned}\Delta I_{SQ1} &= \alpha_F I_0\left[\left\{\frac{V_1+V_K}{2V_T}-\frac{1}{3}\left(\frac{V_1+V_K}{2V_T}\right)^3\right\}-\left\{\frac{V_1-V_K}{2V_T}-\frac{1}{3}\left(\frac{V_1+V_K}{2V_T}\right)^3\right\}\right] \\ &= \alpha_F I_0\left\{\frac{V_K}{V_T}-\frac{2}{3}\left(\frac{V_K}{2V_T}\right)^3-\frac{V_K}{4V_T^3}V_1^2\right\} \\ &= \frac{\alpha_F I_0 V_K}{V_T}\left\{1-\frac{1}{12}\left(\frac{V_K}{V_T}\right)^2-\frac{V_1^2}{4V_T^2}\right\}\end{aligned} \tag{22}$$

From the equation (22), it is seen that the differential output current $\Delta I_{SQ1}$ is proportional to the square of the input voltage $V_1$. Accordingly, it can be found that the squaring circuit 1 has the square-law characteristic.

By the same way, a differential output current of the second squaring circuit 2, which is applied with the second input voltage $V_2$, can be obtained as follows;

$$\Delta I_{SQ1}=\frac{\alpha_F I_0 V_K}{V_T}\left\{1-\frac{1}{12}\left(\frac{V_K}{V_T}\right)^2-\frac{V_2^2}{4V_T^2}\right\} \tag{23}$$

When the respective differential output ends of the first and second squaring circuits 1 and 2 are connected to each other as shown in FIG. 2, the differential output current $\Delta I_M$ of the circuit thus obtained is given as;

$$\begin{aligned}\Delta I_M &= I^+-I^- \\ &= \Delta I_{SQ1}-\Delta I_{SQ2} \\ &= -\frac{\alpha_F I_0 V_K}{4V_T^3}(V_1^2-V_2^2)\end{aligned} \tag{24}$$

Here, the voltages $V_1$ and $V_2$ are expressed as $V_1=V_x+V_y$ and $V_2=V_x-V_y$, respectively, then the differential output current $\Delta I_M$ of the multiplier of the first embodiment can be obtained as the following equation (25);

$$\Delta I_M=-\frac{\alpha_F I_0 V_K}{V_T^3}V_xV_y \tag{25}$$

Similar to the equation (16), it is seen that from the equation (25) the differential output current $\Delta I_M$ of the multiplier is proportional to the product $(V_x\cdot V_y)$ of the first and second input signal voltages $V_x$ and $V_y$. Accordingly, a multiplication result of the input voltages $V_x$ and $V_y$ can be obtained from the differential output current $\Delta I_M$.

Figure 4:
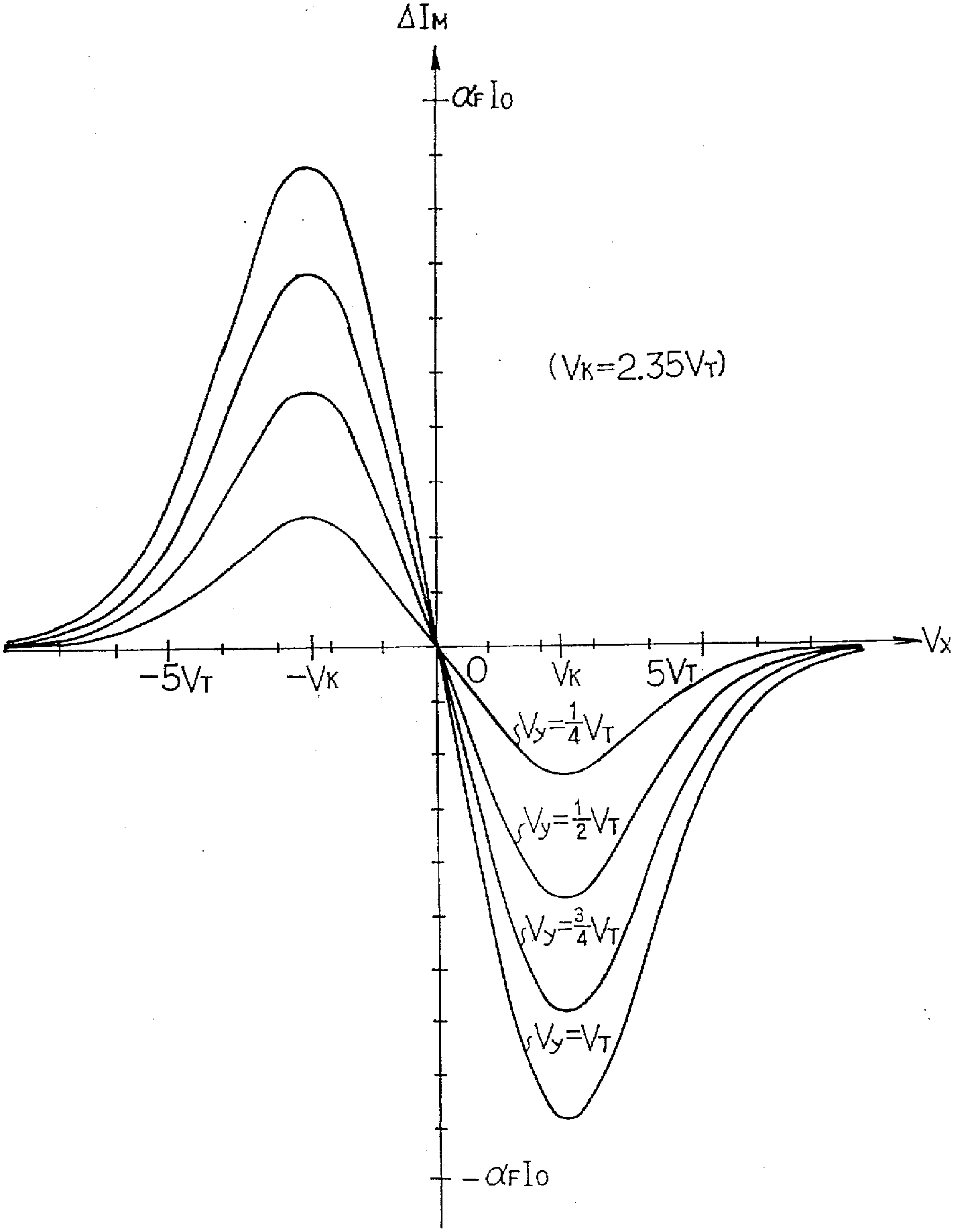
FIG. 4 is a diagram showing the differential output current characteristic of the multiplier of the first embodiment.

FIG. 4 shows a relationship between the differential output current $\Delta I_M$ and the first input voltage $V_x$, in which the second input voltage $V_y$ is a parameter and $V_k=2.35\ V_T$. FIG. 4 was obtained based on an expression of the differential output current $\Delta I_M$, which is different from that in the equation (25). This expression of $\Delta I_M$ was given by using the equation (21) including the hyperbolic tangent function.

Figure 5:
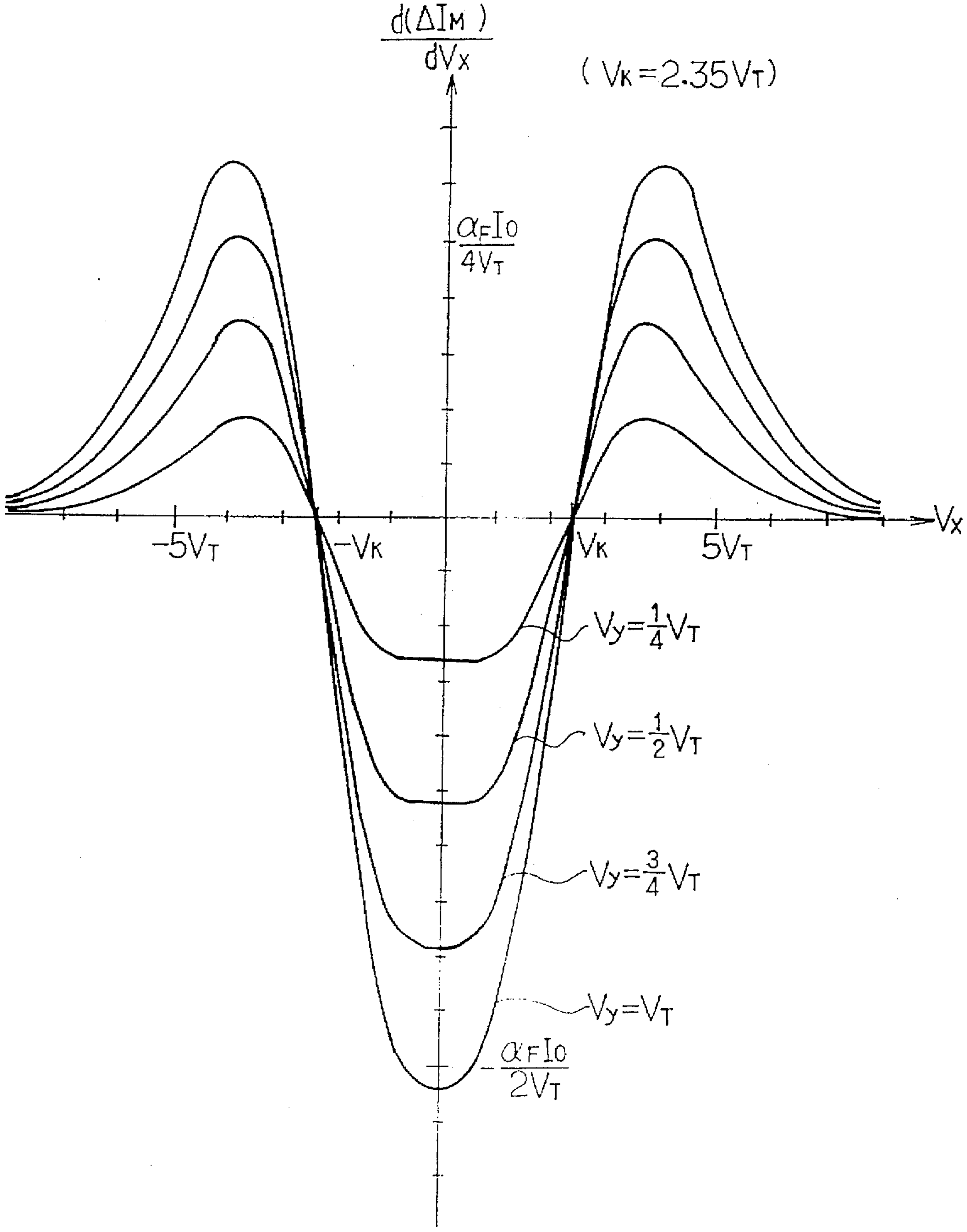
FIG. 5 is a diagram showing the transconductance characteristic of the multiplier of the first embodiment.

FIG. 5 shows the transconductance characteristic of the multiplier, in which the second input voltage $V_y$ is a parameter and $V_k=2.35\ V_T$, similar to FIG. 4. The transconductance $(d\Delta I_M/dV_x)$ was obtained by differentiating the expression of $\Delta I_M$ used for obtaining FIG. 4 by the first input voltage $V_x$. It is seen from FIG. 5 that when $V_k=2.35\ V_T$ the transconductance of the multiplier becomes maximally flat.

Although not shown, the transconductance characteristic becomes a curve having a single peak when $V_k<2.35\ V_T$, and that having twin peaks when $V_k>2.35\ V_T$.

As described above, with the multiplier according to the first embodiment, there are provided with four differential pairs arranged so-called in a line transversely to be driven by the same power source voltage and the differential pairs are applied with the first and second input voltages $V_x$ and $V_y$ superposed on the DC bias voltages $V_k$ to obtain the square-law characteristic. As a result, the multiplier can be operated at a lower power source voltage as well as simple in circuit configuration.

In addition, since the respective differential pairs may be composed of the minimum unit transistors, the multiplier is suitable for high-frequency operation.

[Second Embodiment]

Figure 6:
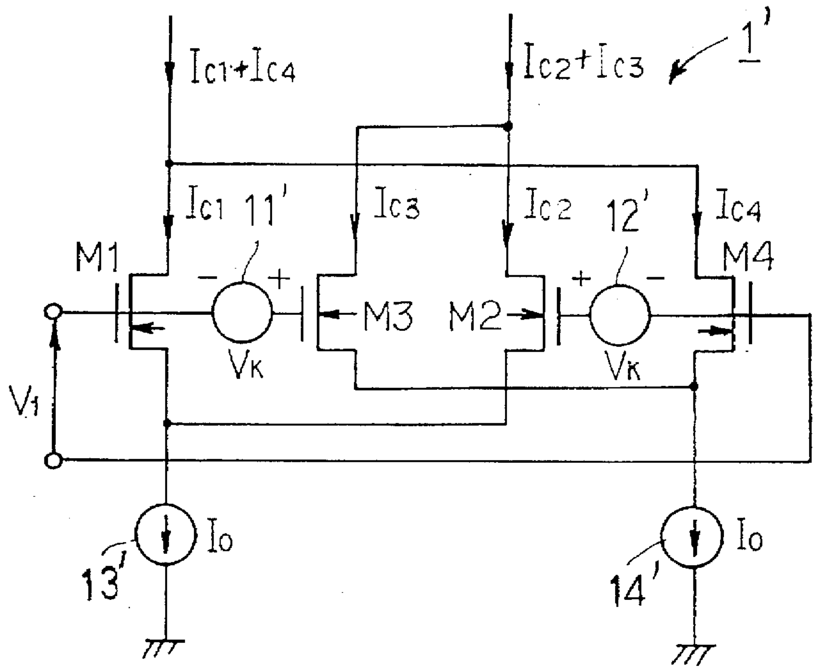
FIG. 6 is a circuit diagram of a squaring circuit used for the multiplier according to the second embodiment, which is formed of MOS transistors.

FIG. 6 shows a squaring circuit 1' used for a multiplier according to a second embodiment, in which MOS transistors M1, M2, M3 and M4 are employed instead of the bipolar transistors Q1, Q2, Q3 and Q4 in the squaring circuit 1 of the first embodiment. The interconnection of the MOS transistors M1 to M4 is the same as that of the squaring circuit 1.

The squaring circuit 1' is comprised of a first differential pair driven by a first constant current source 13' (current: $I_0$) and a second differential pair driven by a second constant current source 14' (current: $I_0$). The first differential pair is composed of the MOS transistors M1 and M2 whose sources are connected in common to the first constant current source 13'. The second differential pair is composed of MOS transistors M3 and M4 whose sources are connected in common to the second constant current source 14'.

Drains of the transistors M1 and M4 are coupled together and those of the transistors M2 and M3 are coupled together. These drains thus coupled together constitute a pair of differential output ends of the squaring circuit 1', respectively.

Gates of the transistors M1 and M4 constitute a pair of differential input ends of the squaring circuit 1', and a first input voltage $V_1$ is applied therebetween.

There is a first DC voltage source 11' whose supply voltage is $V_k$ between the gates of the transistors M1 and M3. A positive (+) end of the first voltage source 11' is connected to the gate of the transistor M3 and a negative (−) end thereof is to the gate of the transistor M1. Similarly, there is a second DC voltage source 12' whose supply voltage is the same as that of the voltage source 11', or $V_k$, between the gates of the transistors M2 and M4. A positive (+) end of the voltage source 12' is connected to the gate of the transistor M2 and a negative (−) end thereof is to the gate of the transistor M4.

Therefore, a first DC bias voltage $V_k$ is applied across the gates of the transistors M1 and M3 and a second DC bias voltage $V_k$, which is equal in value to the first one, is applied across the gates of the transistors M4 and M2. The first and second bias voltages are applied in the same polarities.

Operation of the squaring circuit 1' is as follows;

If the MOS transistors M1, M2, M3 and M4 are operating in the saturation region, differential output currents $\Delta I_i$ of the first and second differential pairs can be expressed as the following equations (26-1) and (26-2), respectively;

$$\Delta I_i = 2^{1/2} I_0 (V_i/V_u)[1-\{V_i^2/(2V_u^2)\}]^{1/2} \quad |V_i| \leq V_u \qquad (26\text{-}1)$$

$$\Delta I_i = I_0 \,\mathrm{sgn}(V_i) \quad |V_i| \leq V_u \qquad (26\text{-}2)$$

where i=1 and 2.

In the equations (26-1) and (26-2), $V_u$ is expressed as $V_u=(I_0/\beta)^{1/2}$ by using the transconductance parameter β, and β is expressed as $\beta=(1/2)\mu C_{ox}(W/L)$ where μ is the effective surface mobility, $C_{ox}$ is the gate-oxide capacity per unit area, W is the gate width and L is the gate length of the MOS transistor.

The equation (26-1) can be approximated by the following equation (27).

$$f(V_i) = \sqrt{2}\, I_0 \left\{ \frac{V_i}{V_u} - \left(1 - \frac{1}{\sqrt{2}}\right) \frac{V_i^3}{V_u^3} \right\} \quad |V_i| \leq V_u \qquad (27)$$

The equation (27) is in inaccuracy or error within 3% with respect to the equation (26-1) which is obtained based on the square-law characteristic of the MOS transistor when $|V_i| \leq V_u$.

The values obtained through the SPI$_C$ E simulation using Shockley's Equation is also in inaccuracy or error within 3% with respect to the equation (26-1) when $|V_i| \leq V_u$, however, the inaccuracy or error between the simulation values and the equation (27) is better than that between the simulation values and the equation (26-1). Therefore, the equation (27) is better in approximation than the equation (26-1) and as a result, the equation (27) is very good approximation for the purpose of providing the input-output characteristic of the MOS differential pairs.

Then, when $V_i$ is expressed as $V_i=V_1 \pm V_k$ in the equation (26-1), a differential output current $\Delta I_{SQ1}$ of the first and second differential pairs is given as;

$$\begin{aligned} \Delta I_{SQ1} &= \Delta I_1 - \Delta I_2 \qquad (28) \\ &= \sqrt{2}\, I_0 \left\{ \frac{V_1+V_K}{V_u} \sqrt{1 - \frac{(V_1+V_K)^2}{2V_u^2}} - \frac{V_1-V_K}{V_u} \sqrt{1 - \frac{(V_1-V_K)^2}{2V_u^2}} \right\} \\ &|V_1 \pm V_K| \leq V_u \end{aligned}$$

If the equation (27) is substituted into the equation (28), the differential output current $\Delta I_{SQ1}$ can be given as the following equation (29);

$$\Delta I_{SQ1} \approx 2\sqrt{2}\, I_0 \left\{ \frac{V_K}{V_u} - \left(1 - \frac{1}{\sqrt{2}}\right) \frac{V_K^3 + 3V_K V_1^2}{V_u^3} \right\} \qquad (29)$$

It is seen that from the equation (29) the differential output current $\Delta I_{SQ1}$ is proportional to the square of the input voltage $V_1$, which means that the circuit shown in FIG. 5 has the square-law characteristic.

The multiplier according to the second embodiment contains two of the squaring circuits 1' shown in FIG. 5 as the squaring circuits 1 and 2 in FIG. 2, so that the differential output current $\Delta I_M$ of the multiplier can be given as;

$$\begin{aligned} \Delta I_M &= \Delta I_{SQ1} - \Delta I_{SQ2} \qquad (30) \\ &\approx -6\sqrt{2}\, I_0 \left(1 - \frac{1}{\sqrt{2}}\right) \frac{V_K}{V_u^3} (V_1^2 - V_2^2) \\ &|V_1 \pm V_K| \leq V_u \end{aligned}$$

Here, similar to the first embodiment, the voltages $V_1$ and $V_2$ are expressed as $V_1=V_x+V_y$ and $V_2=V_x-V_y$, respectively, then the equation (30) becomes as the following equation (31);

$$\begin{aligned} \Delta I_M &\approx -24\sqrt{2}\, I_0 \left(1 - \frac{1}{\sqrt{2}}\right) \frac{V_K}{V_u^3} (V_x \cdot V_y) \\ &|V_x \pm V_y \pm V_K| \leq V_u \end{aligned}$$

It is seen that from the equation (31) the differential output current $\Delta I_M$ is proportional to the product $(V_x \cdot V_y)$ of the first and second input voltages $V_x$ and $V_y$, which means that the multiplication result is derived from the current $\Delta I_M$.

Figure 7:
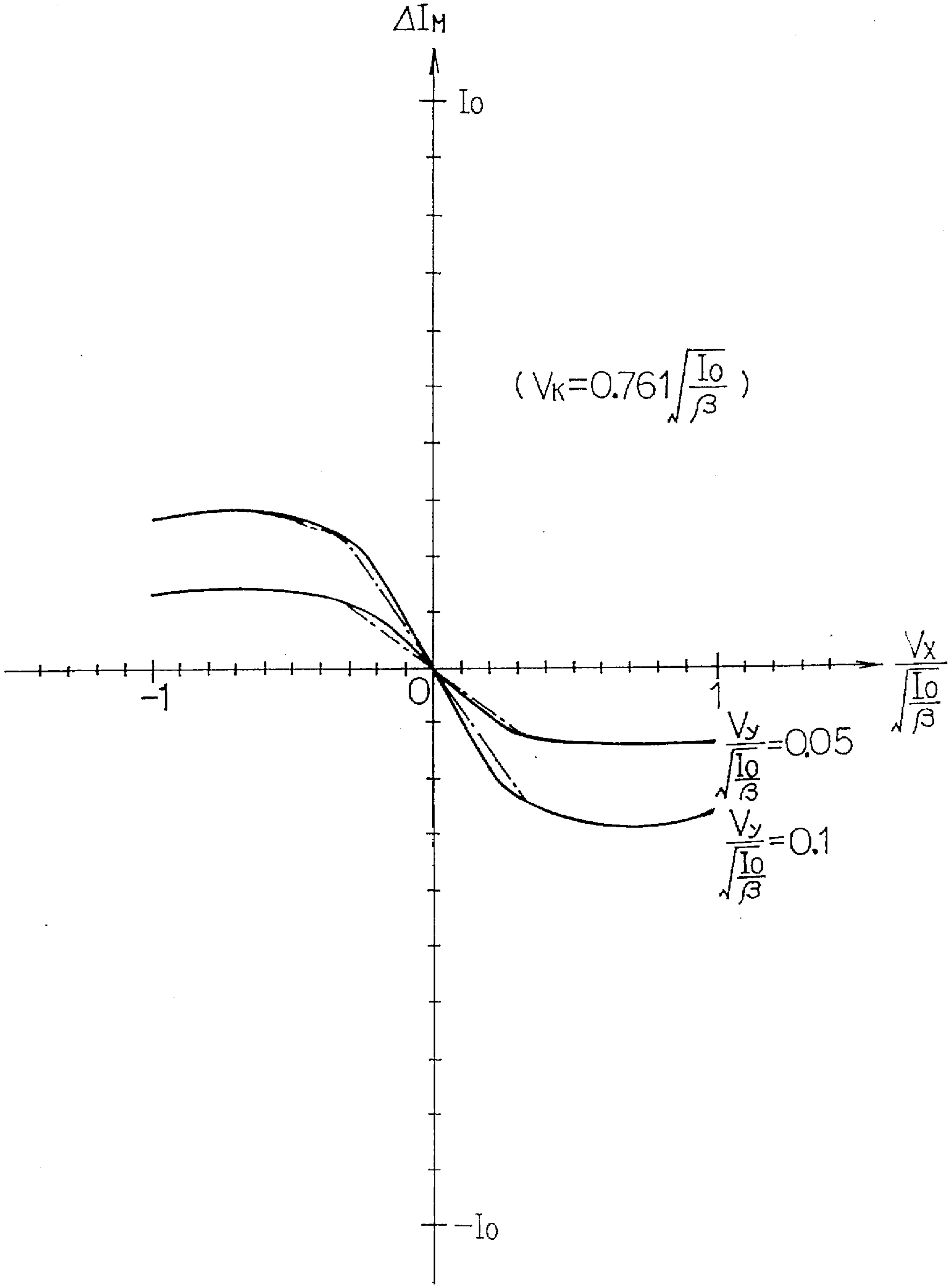
FIG. 7 is a diagram showing the differential output current characteristic of the multiplier of the second embodiment.

FIG. 7 shows the differential output current characteristics of the multiplier of the second embodiment, in which the solid lines show the differential output current $\Delta I_M$ obtained from the equations (26-1) and (26-2) and the alternate long and short dash lines show that obtained approximately from the equation (27). It is seen that from FIG. 7 the approximation using the equation (27) is considerably good.

Figure 8:
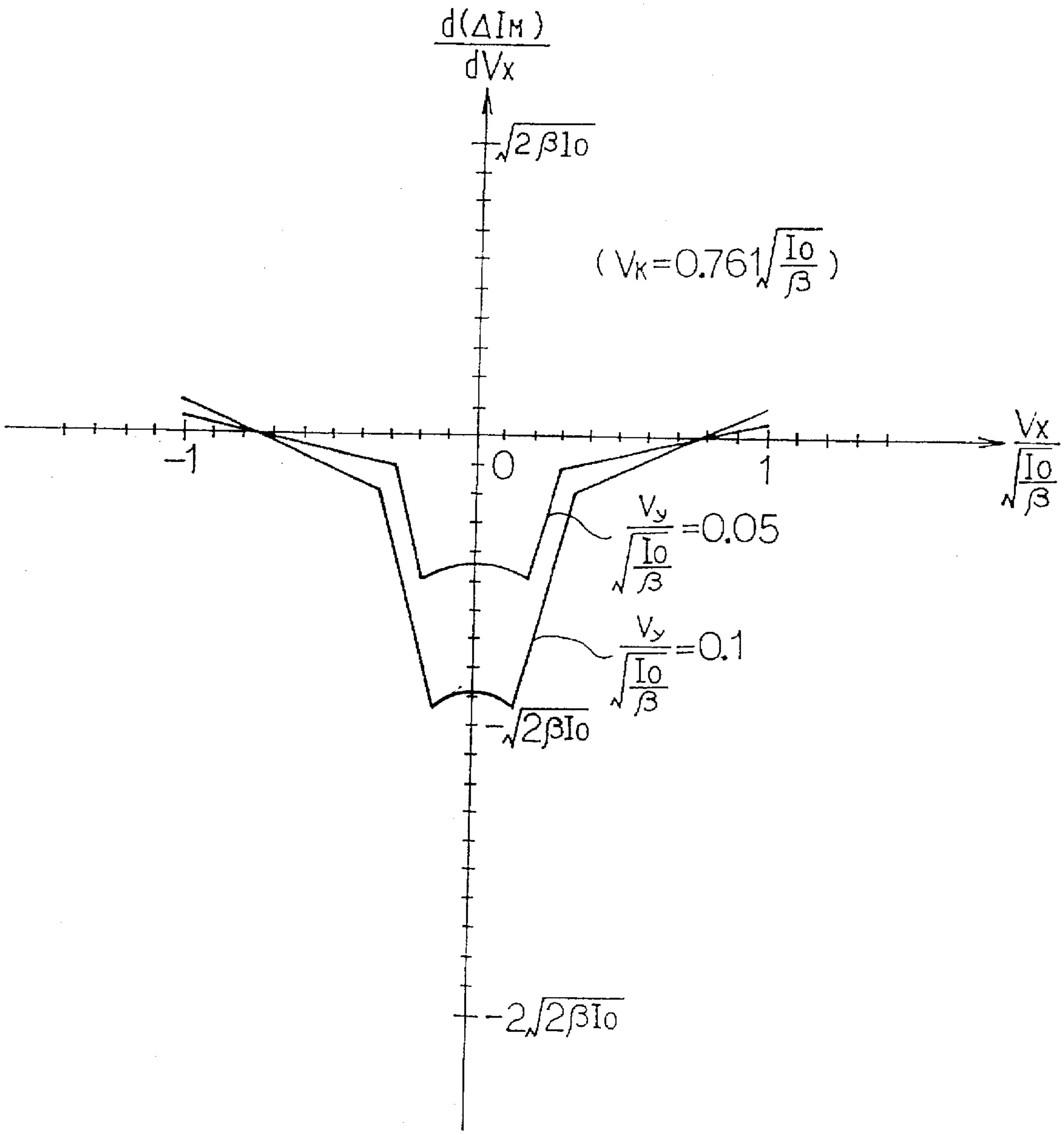
FIG. 8 is a diagram showing the transconductance characteristic of the multiplier of the second embodiment.

FIG. 8 shows the transconductance characteristic of the multiplier, in which $V_k=0.761\ V_u$. It is seen from FIG. 8 that when $V_k=0.761\ V_u$ the transconductance of the multiplier becomes approximately linear.

There can be provided with the same advantages or effects as those of the first embodiment.

[Third Embodiment]

Figure 9:
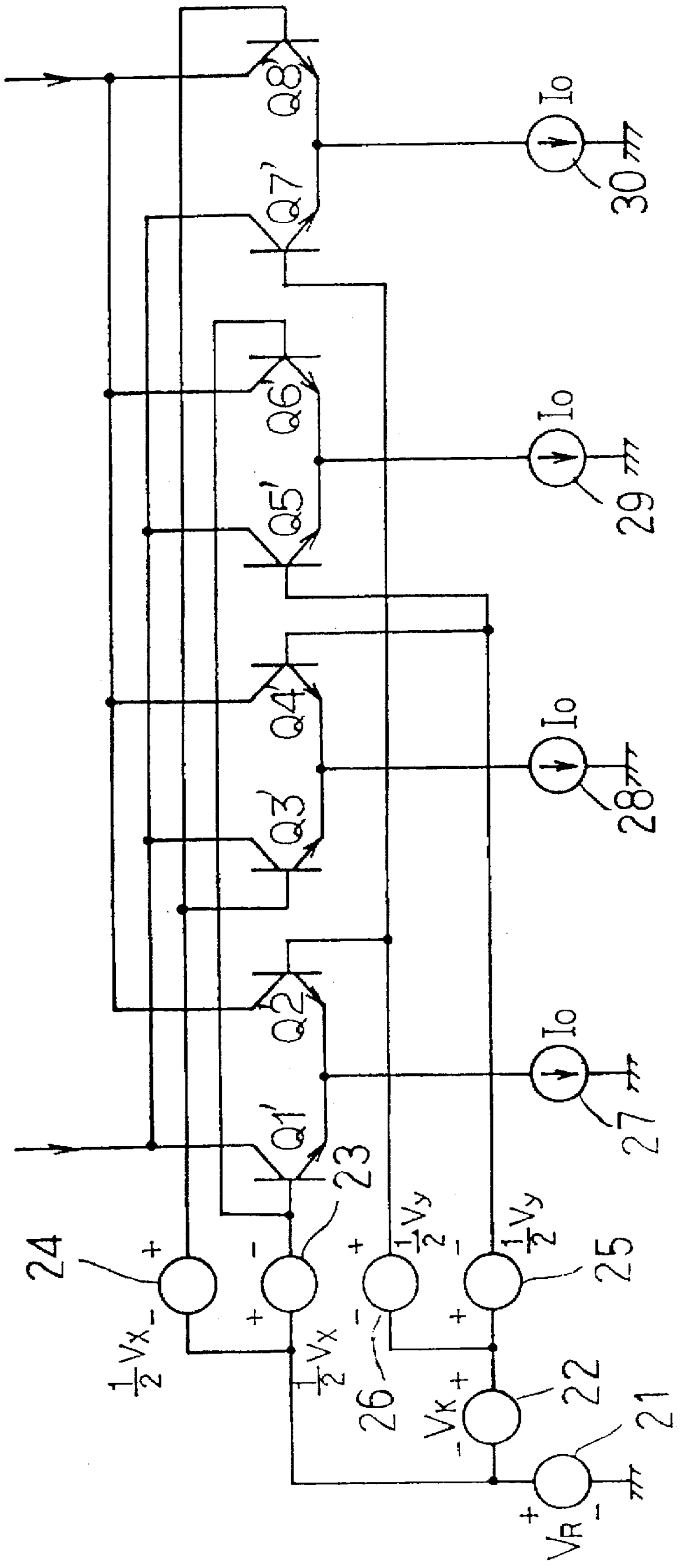
FIG. 9 is a circuit diagram of a multiplier according to a third embodiment, which is formed of bipolar transistors.

FIG. 9 shows a multiplier according to a third embodiment of the present invention, which comprises four differential transistor-pairs driven by respective constant current sources.

In FIG. 9, a first differential pair is composed of bipolar transistors Q1' and Q2' whose emitters are connected in common to a first constant current source 27 (current: $I_0$) A second differential pair is composed of bipolar transistors Q3' and Q4' whose emitters are connected in common to a second constant current source 28 (current: $I_0$). A third differential pair is composed of bipolar transistors Q5' and Q6' whose emitters are connected in common to a third constant current source 29 (current: $I_0$). A fourth differential pair is composed of bipolar transistors Q7' and Q8' whose emitters are connected in common to a fourth constant current source 30 (current: $I_0$).

Collectors of the transistors Q1', Q3', Q5' and Q7' which belong to the first, second, third and fourth differential pairs, respectively are coupled together to form one of a pair of differential output ends of the multiplier. Similarly, collectors of the transistors Q2', Q4', Q6' and Q8' which belong to the first, second, third and fourth differential pairs, respectively are coupled together to form the other of the pair of differential output ends of the multiplier.

A first input signal voltage $-(1/2)V_x$ from a first signal source 23 is superposed on a first reference voltage $V_R$ from a first reference voltage source 21, which are opposite in phase to each other, to be applied to a base of the transistor Q1' of the first differential pair and to that of the transistor Q6' of the third differential pair.

The first input signal voltage $(1/2)V_x$ from a second signal source 24 is superposed on the first reference voltage $V_R$, which are equal in phase to each other, to be applied to a base of the transistor Q3' of the second differential pair and that of the transistor Q8' of the fourth differential pair.

A second input signal voltage $-(1/2)V_y$ from a third signal source 25 is superposed on a second reference voltage $(V_R+V_K)$, which are opposite in phase to each other, to be applied to a base of the transistor Q4' of the second differential pair and to that of the transistor Q5' of the third differential pair. The second reference voltage ($V_R+V_K$) is generated by the first reference voltage source (voltage: $V_R$) 21 and a second reference voltage source (voltage: $V_K$) 22.

The second input signal voltage (½)$V_y$ from a fourth signal source 26 is superposed on the second reference voltage ($V_R+V_K$), which are equal in phase to each other, to be applied to a base of the transistor Q2' of the first differential pair and that of the transistor Q7' of the fourth differential pair.

In the multiplier having the above-identified configuration, differential input voltages $V_I$, $V_{II}$, $V_{III}$ and $V_{IV}$ of the first to fourth differential pairs are given as the following expressions, respectively;

$$V_I=-\{(½)(V_x+V_y)\}-V_K \quad (32\text{-}1)$$

$$V_{II}=\{(½)(V_x+V_y)\}-V_K \quad (32\text{-}2)$$

$$V_{III}=\{(½)(V_x-V_y)\}+V_K \quad (32\text{-}3)$$

$$V_{IV}=-\{(½)(V_x-V_y)\}+V_K \quad (32\text{-}4)$$

Accordingly, a differential output current $\Delta I_M'$ of the multiplier can be expressed as the following equations (33);

$$\Delta I'_M=\alpha_F I_0\left[\tanh\left\{\frac{-\frac{1}{2}(V_x+V_y)-V_K}{2V_T}\right\}+\tanh\left\{\frac{\frac{1}{2}(V_x+V_y)-V_K}{2V_T}\right\}+\tanh\left\{\frac{\frac{1}{2}(V_x-V_y)+V_K}{2V_T}\right\}+\tanh\left\{\frac{-\frac{1}{2}(V_x-V_y)+V_K}{2V_T}\right\}\right]=$$
$$\alpha_F I_0\left[-\tanh\left\{\frac{\frac{1}{2}(V_x+V_y)+V_K}{2V_T}\right\}+\tanh\left\{\frac{\frac{1}{2}(V_x+V_y)-V_K}{2V_T}\right\}+\tanh\left\{\frac{\frac{1}{2}(V_x-V_y)+V_K}{2V_T}\right\}-\tanh\left\{\frac{\frac{1}{2}(V_x-V_y)-V_K}{2V_T}\right\}\right] \quad (33)$$

It is seen that from the equation (33) the differential output current $\Delta I_M'$ is expressed by two terms made of difference between two hyperbolic tangent functions, which means that the first to fourth differential pairs provide the square-law characteristics, respectively.

Accordingly, if tanh is expanded by using the equation (14), when $|(½)(V_x+V_y)-V_K|<<2\ V^T$ and $|(½)(V_x-V_y)-V_K|<<2\ V_T$, the equation (33) is changed to the following expression (34) through the same approximation as used for obtaining the equation (25).

$$\Delta I'_M\approx\frac{\alpha_F I_0 V_K}{4V_T^3}V_xV_y \quad (34)$$

It is seen that from the expression (34) the differential output current $\Delta I_M'$ is proportional to product ($V_{x\cdot}V_y$) of the first and second input voltages $V_x$ and $V_y$, resulting in an multiplication result thereof.

The equation (34) is the same as the equation (25) except for a coefficient (¼), so that the multiplier of the third embodiment has the same advantages or effects as those of the first and second embodiments.

[Fourth Embodiment]

Figure 10:
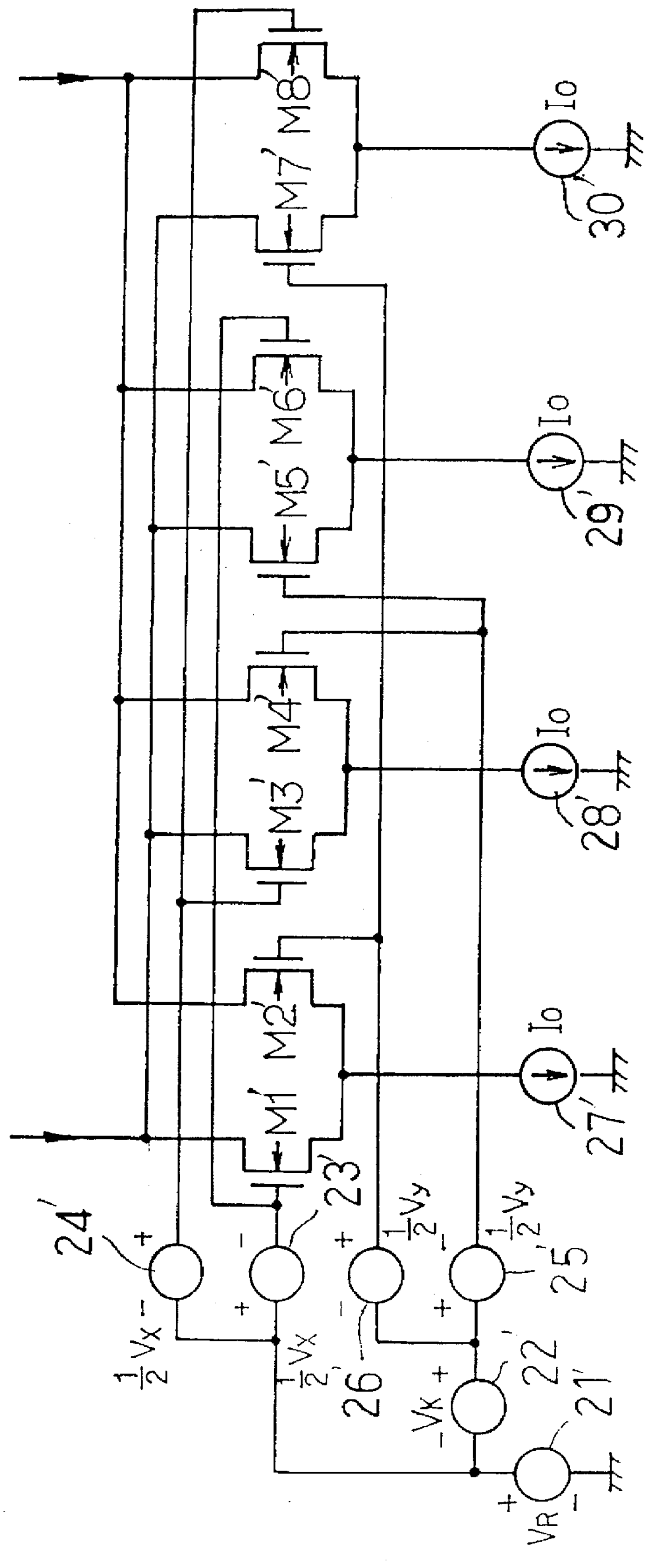
FIG. 10 is a circuit diagram of a multiplier according to a fourth embodiment, which is formed of MOS transistors.

FIG. 10 shows a multiplier according to a fourth embodiment of the present invention, which employs MOS transistors instead of the bipolar transistors in the third embodiment.

In FIG. 10, a first differential pair is composed of MOS transistors M1' and M2' whose sources are connected in common to a first constant current source 27' (current: $I_0$). A second differential pair is composed of MOS transistors M3' and M4' whose sources are connected in common to a second constant current source 28' (current: $I_0$). A third differential pair is composed of MOS transistors M5' and M6' whose sources are connected in common to a third constant current source 29' (current: $I_0$). A fourth differential pair is composed of MOS transistors M7' and M8' whose sources are connected in common to a fourth constant current source 30'(current: $I_0$).

Drains of the transistors M1', M3', M5' and M7' which belong to the first, second, third and fourth differential pairs, respectively are coupled together to form one of a pair of differential output ends of the multiplier. Similarly, drains of the transistors M2', M4', M6' and M8' which belong to the first, second, third and fourth differential pairs, respectively are coupled together to form the other of the pair of differential output ends of the multiplier.

A first input signal voltage −(½)$V_x$ from a first signal source 23' is superposed on a first reference voltage $V_R$ from a first reference voltage source 21', which are opposite in phase to each other, to be applied to a gate of the transistor M1' of the first differential pair and to that of the transistor M6' of the third differential pair.

The first input signal voltage (½)$V_x$ from a second signal source 24' is superposed on the first reference voltage $V_R$, which are equal in phase to each other, to be applied to a gate of the transistor M3' of the second differential pair and that of the transistor M8' of the fourth differential pair.

A second input signal voltage −(½)$V_y$ from a third signal source 25 is superposed on a second reference voltage ($V_R+V_K$), which are opposite in phase to each other, to be applied to a gate of the transistor M4' of the second differential pair and to that of the transistor M5' of the third differential pair. The second reference voltage ($V_R+V_K$) is generated by the first reference voltage source 21' (voltage: $V_R$) and a second reference voltage source 22' (voltage: $V_K$).

The second input signal voltage (½)$V_y$ from a fourth signal source 26' is superposed on the second reference voltage ($V_R+V_K$), which are equal in phase to each other, to be applied to a gate of the transistor M2' of the first differential pair and that of the transistor M7' of the fourth differential pair.

In the multiplier having the above-identified configuration, similar to the third embodiment shown in FIG. 9, differential input voltages $V_I$, $V_{II}$, $V_{III}$ and $V_{IV}$ of the first to fourth differential pairs are given as the expressions (32-1), (32-2), (32-3) and (32-4), respectively;

Accordingly, a differential output current $\Delta I_M'$ of the multiplier can be expressed as the following equation (35);

$$\Delta I'_M = \Delta I'_{SQ1} - \Delta I'_{SQ2} \qquad (35)$$

$$= -6\sqrt{2}\, I_0\left(1-\frac{1}{\sqrt{2}}\right)\frac{V_K}{V_u^3}\cdot\left[\left\{\frac{1}{2}(V_x+V_y)\right\}^2 - \left\{\frac{1}{2}(V_x-V_y)\right\}^2\right]$$

$$= -6\sqrt{2}\, I_0\left(1-\frac{1}{\sqrt{2}}\right)\frac{V_K}{V_u^3}\, V_xV_y$$

$$\left|\frac{1}{2}(V_x \pm V_y) \pm V_K\right| \leq V_u$$

Similar to the second embodiment shown in FIGS. 2 and 6, from the equation (35), it is seen that the differential output current $\Delta I_M'$ is proportional to product ($V_x \cdot V_y$) of the first and second input voltages $V_x$ and $V_y$. The equation (35) is the same as the equation (31) in the second embodiment except for a coefficient (¼), so that the multiplier of the fourth embodiment has the same advantages or effects as those of the second embodiment.

[Fifth Embodiment]

Figure 11:
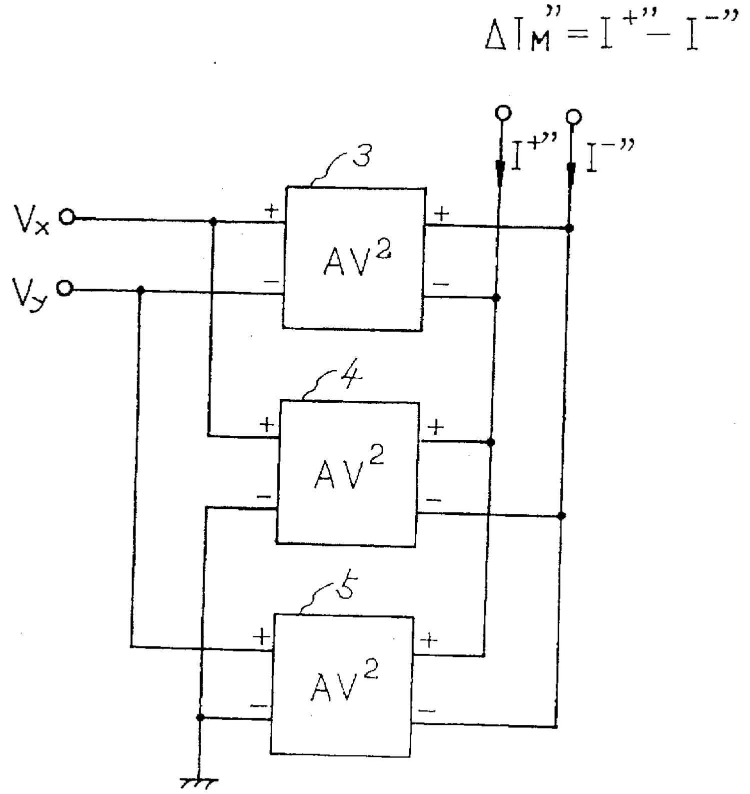
FIG. 11 is a block diagram of a multiplier according to a fifth embodiment of the present invention.

FIG. 11 shows a multiplier according to a fifth embodiment of the present invention, which is formed of first, second and third squaring circuits 3, 4 and 5. These squaring circuits 3, 4 and 5 are the same in circuit configuration and each of them is composed of the squaring circuit shown in FIG. 3 or 6, similar to the first embodiment shown in FIG. 2.

In FIG. 11, the first, second and third squaring circuits 1, 2 and 3 have each a pair of differential input ends and a pair of differential output ends. Positive (+) one of the differential output ends of the first squaring circuit 3 and opposite (−) ones of the differential output ends of the second and third squaring circuits 4 and 5 are coupled together, and opposite (−) one of the differential output ends of the first squaring circuit 3 and positive (+) ones of the differential output ends of the second and third squaring circuits 2 and 3 are coupled together. These respective output ends coupled together constitute a pair of differential output ends of the multiplier.

In the first squaring circuit 3, a first input signal voltage $V_x$ is applied to the positive (+) one of the differential input ends and a second input signal voltage $V_y$ is applied to the opposite (−) one of the differential input ends. Thus, the difference voltage ($V_{x-Vy}$) of the first and second input signals $V_x$ and $V_y$ is applied across the differential input ends.

In the second squaring circuit 4, the first input signal voltage $V_x$ is applied to the positive (+) one of the differential input ends and the opposite (−) one of the differential input ends is grounded, that is, the opposite one is held at the earth potential. Thus, the first input signal voltage $V_x$ is applied across the differential input ends.

In the third squaring circuit 5, the second input signal voltage $V_y$ is applied to the positive (+) one of the differential input ends and the opposite (−) one of the differential input ends is grounded. Thus, the second input signal voltage $V_y$ is applied across the differential input ends.

With the multiplier having the configuration as above, a differential output current $\Delta I_M''$ of the multiplier is expressed as the following equation (36) as;

$$\Delta I_M'' = I^{+''} - I^{-''} \qquad (36)$$

$$= -A(V_x - V_y)^2 + AV_x^2 + V_y^2$$

$$= AV_xV_y$$

It is seen that from the equation (36) a multiplication result of the first and second input signal voltages $V_x$ and $V_y$ can be obtained from the current $\Delta I_M''$.

In the fifth embodiment, the input voltage range of the multiplier is narrower than those of the first and second embodiments, however, there is an advantage that no negative-phase input voltage and no differential input one are required for all the squaring circuits 3 and 4.

[Sixth Embodiment]

Figure 12:
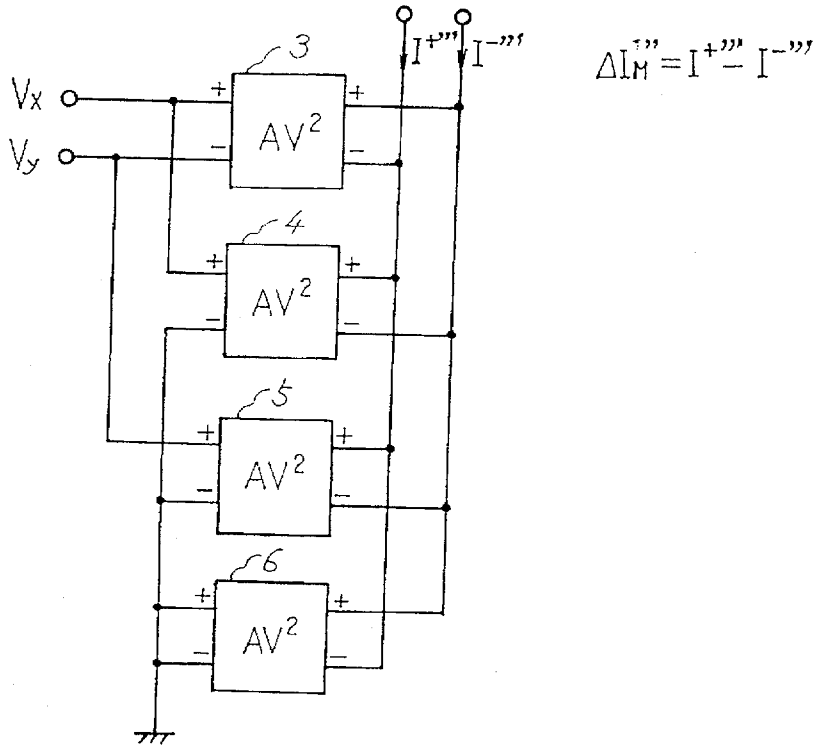
FIG. 12 is a block diagram of a multiplier according to a sixth embodiment of the present invention.

FIG. 12 shows a multiplier according to a sixth embodiment of the present invention, which is comprised of a fourth squaring circuit 6 in addition to the fifth embodiment shown in FIG. 11. The fourth squaring circuits 6 is the same in circuit configuration and is composed of the squaring circuit shown in FIG. 3 or 6.

In FIG. 12, positive (+) and opposite (−) ones of differential output ends of the fourth squaring circuit 6 are connected to the positive and opposite ones of the differential output ends of the first squaring circuit 3, respectively. A pair of the differential input ends of the fourth squaring circuit 6 are connected in common to be grounded, that is, are held at the earth potential.

With the sixth embodiment, there is an advantage that a DC component of a differential output current $\Delta I_M'''$($=I^{+'''} - I^{-'''}$) of the multiplier can be removed due to the function of the fourth squaring circuit 6.

Figure 13:
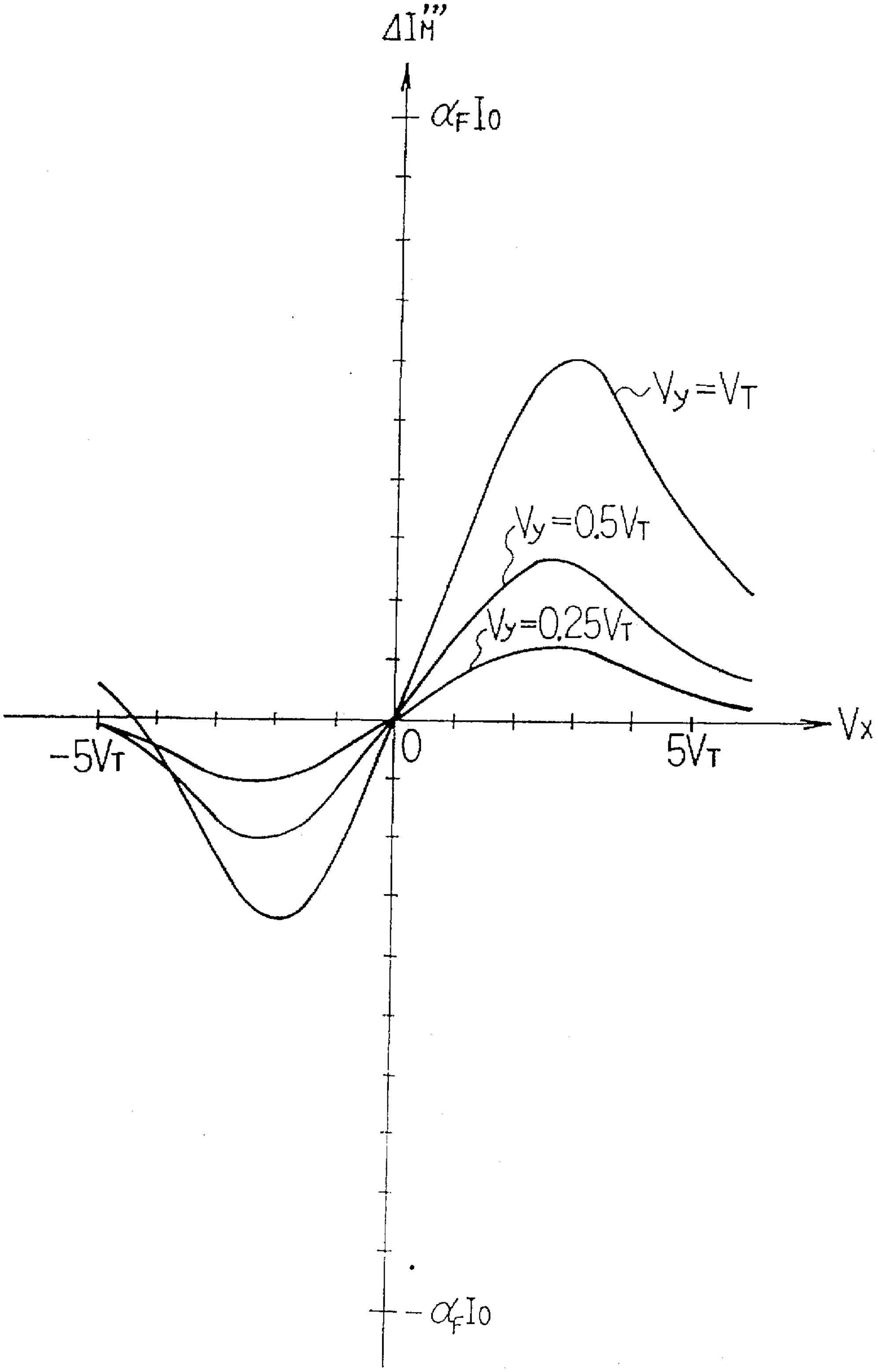
FIG. 13 is a diagram showing the differential output current characteristic of the multiplier of the sixth embodiment.

An example of the differential output characteristics of the multiplier is shown in FIG. 13. FIG. 13 was obtained by using the bipolar squaring circuits as shown in FIG. 3 where $V_K$=2.35 $V_T$. It is seen that from FIG. 13 the same characteristics as those in FIG. 4 are given.

What is claimed is:

1. A multiplier comprising:

first, second, third and fourth differential transistor-pairs;

first output ends of said first, second, third and fourth differential transistor-pairs being coupled together and second output ends of said first, second, third and fourth differential transistor-pairs being coupled together, said first output ends and second output ends thus coupled together constituting a pair of differential output ends of said multiplier;

a first input voltage superposed on a first reference voltage, which are opposite in phase to each other, being applied in common to said first input end of said first differential transistor-pair and said second input end of said third differential transistor-pair;

said first input voltage superposed on said first reference voltage, which are equal in phase to each other, is applied in common to said first input end of said second differential transistor-pair and said second input end of said fourth differential transistor-pair;

a second input voltage superposed on a second reference voltage, which are equal in phase to each other, is applied in common to a second input end of said first differential transistor-pair and a first input end of said fourth differential transistor-pair;

said second input voltage superposed on said second reference voltage, which are opposite in phase to each other, being applied in common to a second input end of said second differential transistor-pair and a first input end of said third differential transistor-pair; and said second reference voltage having a magnitude which is equal to the magnitude of the first reference voltage combined with another quantity.

2. A multiplier comprising:

a first differential pair of first and second bipolar transistors;

a second differential pair of third and fourth bipolar transistors;

a third differential pair of fifth and sixth bipolar transistors;

a fourth differential pair of seventh and eighth bipolar transistors;

collectors of said first, third, fifth and seventh transistors being coupled together and collectors of said second, fourth, sixth and eighth transistors being coupled together, said collectors thus coupled together constituting a pair of differential output ends of said multiplier;

a first input voltage superposed on a first reference voltage, which are opposite in phase to each other, being applied in common to said bases of said first transistor and said sixth transistor;

said first input voltage superposed on said first reference voltage, which are equal in phase to each other, being applied in common to said bases of said third transistor and said eighth transistor;

a second input voltage superposed on a second reference voltage, which are equal in phase to each other, being applied in common to bases of said second transistor and said seventh transistor;

said second input voltage superposed on said second reference voltage, which are opposite in phase to each other, being applied in common to bases of said fourth transistor and said fifth transistor; and said second reference voltage having a magnitude which is equal to the magnitude of the first reference voltage combined with another quantity.

3. A multiplier comprising:

a first differential pair of first and second MOS transistors;

a second differential pair of third and fourth MOS transistors;

a third differential pair of fifth and sixth MOS transistors;

a fourth differential pair of seventh and eight MOS transistors;

drains of said first, third, fifth and seventh transistors being coupled together and drains of said second, fourth, sixth and eighth transistors being coupled together, said drains thus coupled together constituting a pair of differential output ends of said multiplier;

a first input voltage superposed on a first reference voltage, which are opposite in phase to each other, being applied in common to said gates of said first transistor and said sixth transistor;

said first input voltage superposed on said first reference voltage, which are equal in phase to each other, being applied in common to said gates of said third transistor and said eighth transistor;

a second input voltage superposed on a second reference voltage, which are equal in phase to each other, being applied in common to gates of said second transistor and said seventh transistor;

said second input voltage superposed on said second reference voltage, which are opposite in phase to each other, being applied in common to gates of said fourth transistors and said fifth transistor; and said second reference voltage having a magnitude which is equal to the magnitude of the first reference voltage combined with another quantity.

4. A multiplier for multiplying a first input voltage and a second input voltage, comprising:

a first squaring circuit, said first squaring circuit having first and second differential transistor-pairs, differential input ends and differential output ends;

a second squaring circuit, said second squaring circuit having third and fourth differential transistor-pairs, differential input ends and differential output ends;

a third squaring circuit, said third squaring circuit having fifth and sixth differential transistor-pairs, differential input ends and differential output ends;

a positive one of said differential output ends of said first squaring circuit and opposite ones of said differential output ends of said second and third squaring circuits being coupled together, and an opposite one of said differential output ends of said first squaring circuit and positive ones of said differential output ends of said second and third squaring circuits being coupled together, said output ends thus coupled together constituting a pair of differential output ends of said multiplier;

a difference of said first and second input voltages being applied to said differential input ends of said first squaring circuit;

said first input voltage being applied to said positive one of said differential input ends of said second squaring circuit;

said second input voltage being applied to said positive one of said differential input ends of said third squaring circuit; and said opposite ones of said differential input ends of said second and third squaring circuits being held at constant electric potentials, respectively.

5. A multiplier as claimed in claim 4, further comprising a fourth squaring circuit, said fourth squaring circuit having seventh and eighth differential transistor-pairs, differential input ends and differential output ends;

wherein positive and opposite ones of said differential output ends of said fourth squaring circuit are connected to said positive and opposite ones of said differential output ends of said first squaring circuit, respectively, and differential input ends of said fourth squaring circuit are coupled together to be held at said constant electric potentials.

6. A multiplier for multiplying a first input voltage and a second input voltage, comprising:

a first squaring circuit, said first squaring circuit having a first differential pair of first and second bipolar transistors, a second differential pair of third and fourth bipolar transistors, differential input ends and differential output ends;

said differential input ends of said first squaring circuit being formed of bases of said first and fourth transistors and said differential output ends thereof being formed of common-connected collectors of said first and fourth transistors and common-connected collectors of said second and third transistors;

a second squaring circuit, said second squaring circuit having a third differential pair of fifth and sixth bipolar transistors, a fourth differential pair of seventh and eighth bipolar transistors, differential input ends and differential output ends;

said differential input ends of said second squaring circuit being formed of bases of said fifth and eighth transistors and said differential output ends thereof being formed of common-connected collectors of said fifth and eighth transistors and common-connected collectors of said sixth and seventh transistors;

a third squaring circuit, said third squaring circuit having a fifth differential pair of ninth and tenth bipolar transistors, a sixth differential pair of eleventh and twelfth bipolar transistors, differential input ends and differential output ends;

said differential input ends of said third squaring circuit being formed of bases of said ninth and twelfth transistors and said differential output ends thereof being formed of common connected collectors of said ninth and twelfth transistors and common-connected collectors of said tenth and eleventh transistors;

a positive one of said differential output ends of said first squaring circuit and opposite ones of said differential output ends of said second and third squaring circuits being coupled together, and an opposite one of said differential output ends of said first squaring circuit and positive ones of said differential output ends of said second and third squaring circuits being coupled together, said output ends thus coupled together constituting a pair of differential output ends of said multiplier;

a difference of said first and second input voltages being applied to said differential input ends of said first squaring circuit;

said first input voltage being applied to said positive one of said differential input ends of said second squaring circuit;

said second input voltage being applied to said positive one of said differential input ends of said third squaring circuit; and said opposite ones of said differential input ends of said second and third squaring circuits being held at constant potentials.

7. A multiplier as claimed in claim 6, further comprising a fourth squaring circuit, said fourth squaring circuit having a seventh differential pair of thirteenth and fourteenth bipolar transistors, a eighth differential pair of fifteenth and sixteenth bipolar transistors, differential input ends and differential output ends, wherein said differential input ends of said fourth squaring circuit are formed of bases of said thirteenth and fourteenth transistors and said differential output ends thereof are formed of common-connected collectors of said thirteenth and sixteenth transistors and common-connected collectors of said fourteenth and fifteenth transistors;

positive and opposite ones of said differential output ends of said fourth squaring circuit are connected to said positive and opposite ones of said differential output ends of said first squaring circuit, respectively; and said differential input ends of said fourth squaring circuit are coupled together to be held at said constant potentials.

8. A multiplier for multiplying a first input voltage and a second input voltage, comprising:

a first squaring circuit, said first squaring circuit having a first differential pair of first and second MOS transistors, a second differential pair of third and fourth MOS transistors, differential input ends and differential output ends;

said differential input ends of said first squaring circuit being formed of gates of said first and fourth translators and said differential output ends thereof being formed of common-connected drains of said second and third transistors;

a second squaring circuit, said second squaring circuit having a third differential pair of fifth and sixth MOS transistors, a fourth differential pair of seventh and eighth MOS transistors, differential input ends and differential output ends;

said differential input ends of said second squaring circuit being formed of gates of said fifth and eighth transistors and said differential output ends thereof being formed of common-connected drains of said fifth and eighth transistors and common-connected drains of said sixth and seventh transistors;

a third squaring circuit, said third squaring circuit having a fifth differential pair of ninth and tenth MOS transistors, a sixth differential pair of eleventh and twelfth MOS transistors, differential input ends and differential output ends;

said differential input ends of said third squaring circuit being formed on gates of said ninth and twelfth transistors and said differential output ends thereof being formed of common-connected drains of said ninth and twelfth transistors and common-connected drains of said tenth and eleventh transistors;

a positive one of said differential output ends of said first squaring circuit and opposite ones of said differential output ends of said second and third squaring circuits being coupled together, and an opposite one of said differential output ends of said first squaring circuit and positive ones of said differential output ends of said second and third squaring circuits being coupled together, said output ends thus coupled together constituting a pair of differential output ends of said multiplier;

a difference of said first and second input voltages being applied to said differential input ends of said first squaring circuit;

said first input voltage being applied to said positive one of said differential input ends of said second squaring circuit;

said second input voltage being applied to said positive one of said differential input ends of said third squaring circuit; and said opposite ones of said differential input ends of said second and third squaring circuits being held at electric constant potentials.

9. A multiplier as claimed in claim 8, further comprising a fourth squaring circuit, said fourth squaring circuit having a seventh differential pair of thirteenth and fourteenth MOS transistors, an eighth differential pair of fifteenth and sixteenth MOS transistors, differential input ends and differential output ends, wherein said differential input ends of said fourth squaring circuit are formed of gates of said thirteenth and fourteenth transistors and said differential output ends thereof are formed of common-connected drains of said thirteenth and sixteenth transistors and common-connected drains of said fourteenth and fifteenth transistors;

positive and opposite ones of said differential output ends of said fourth squaring circuit are connected to said positive and opposite ones of said differential output ends of said first squaring circuit, respectively; and said differential input ends of said fourth squaring circuit are coupled together to be held at said electric constant potentials.

* * * * *